United States Patent
Tanaka et al.

[11] Patent Number: 5,633,713
[45] Date of Patent: May 27, 1997

[54] METHOD AND SYSTEM FOR EVALUATING DISTRIBUTION OF ABSORPTION LIGHT AMOUNT IN OPTICAL LITHOGRAPHY

[75] Inventors: Satoshi Tanaka, Kawasaki; Soichi Inoue, Yokohama, both of Japan

[73] Assignee: Kabushiki Kaisha Toshiba, Kawasaki, Japan

[21] Appl. No.: 578,427

[22] Filed: Dec. 26, 1995

[30] Foreign Application Priority Data

Dec. 27, 1994 [JP] Japan .................................. 6-325567
Dec. 22, 1995 [JP] Japan .................................. 7-334435

[51] Int. Cl.$^6$ .................................................. G01B 9/02
[52] U.S. Cl. ........................ 356/355; 356/401; 356/357
[58] Field of Search .................................. 356/345, 355, 356/357, 399, 400, 401

[56] References Cited

PUBLICATIONS

T. A. Brunner, "Optimization of Optical Properties of Resist Processes", SPIE vol. 1466, Advances In Resist Technology and Processing VIII (1991), (pp. 297–308); Feb. 1991.
Michael Yeung, "Modeling Aerial Images In Two and Three Dimensions", Proc. Kodak Microelectronics Seminar Interface '85, (pp. 115–126); 1986.
Douglas A. Bernard, et al., "Thin–film Interference Effects In Photolithography For Finite Numerical Apertures", Optical Society of America, vol. 8, No. 1, (pp. 123–133); Jan. 1991.

Primary Examiner—Frank Gonzalez
Assistant Examiner—Robert Kim
Attorney, Agent, or Firm—Oblon, Spivak, McClelland, Maier & Neustadt, P.C.

[57] ABSTRACT

A system for evaluating a distribution of an absorption light amount in a resist comprises a diffractive light intensity distribution calculating unit for calculating a diffractive light intensity distribution on a plane of a pupil of a projection exposing apparatus, a light absorption rate calculating unit for calculating, on the basis of an incidence angle and a thin-film interference effect of each of diffractive light intensity components of the diffractive light intensity distribution passing through the pupil and being incident on a wafer surface of the projection exposing apparatus, a light absorption rate of each of the diffractive light intensity components in a resist of the projection exposing apparatus, a weight calculating unit for calculating a weight of each diffractive light intensity component, on the basis of the light absorption rate of each diffractive light intensity component calculated by the light absorption rate calculating unit, a multiplying unit for multiplying each diffractive light intensity component of the diffractive light intensity distribution by the weight of each diffractive light intensity component calculated by the weight calculating unit, and an integrating unit for integrating, in the plane of the pupil, each diffractive light intensity component multiplied with the weight obtained by the multiplying unit, thereby obtaining an absorption light amount distribution in the resist.

15 Claims, 9 Drawing Sheets

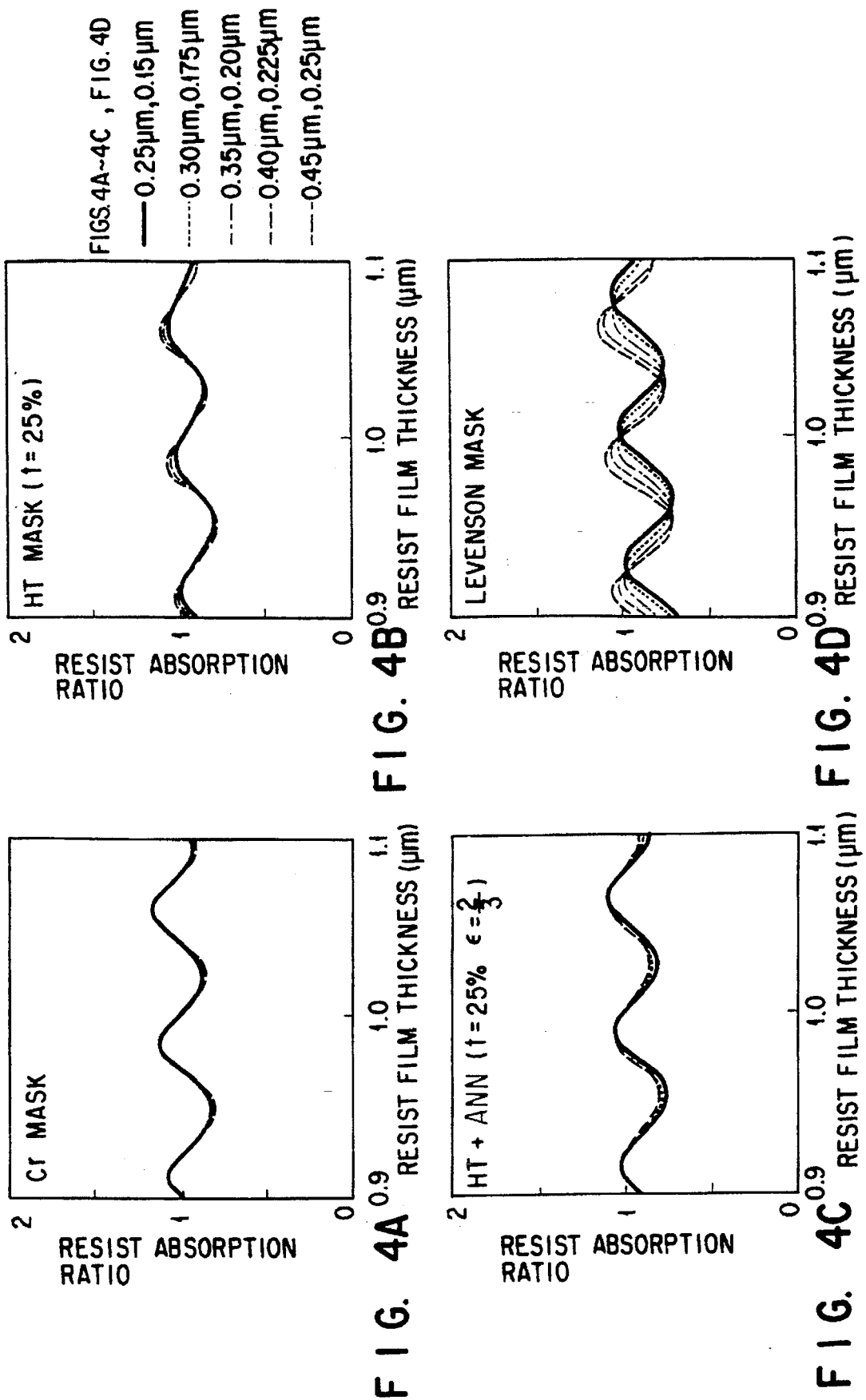

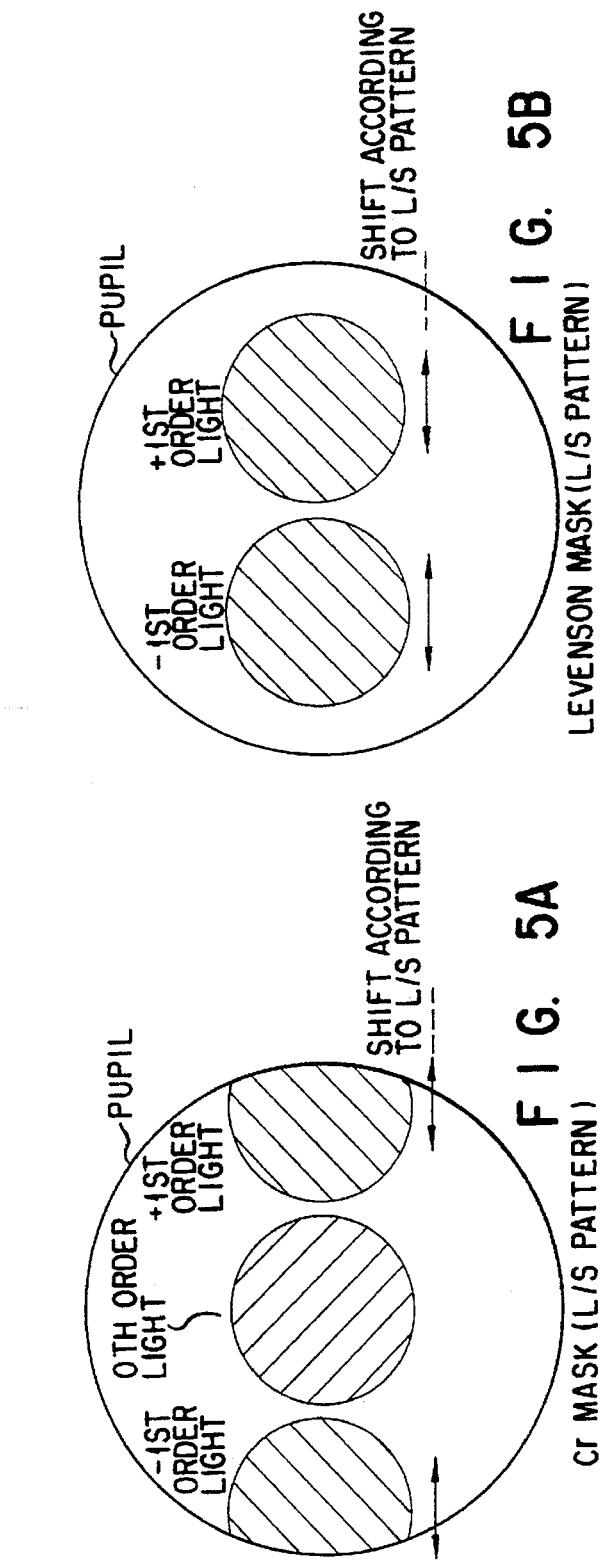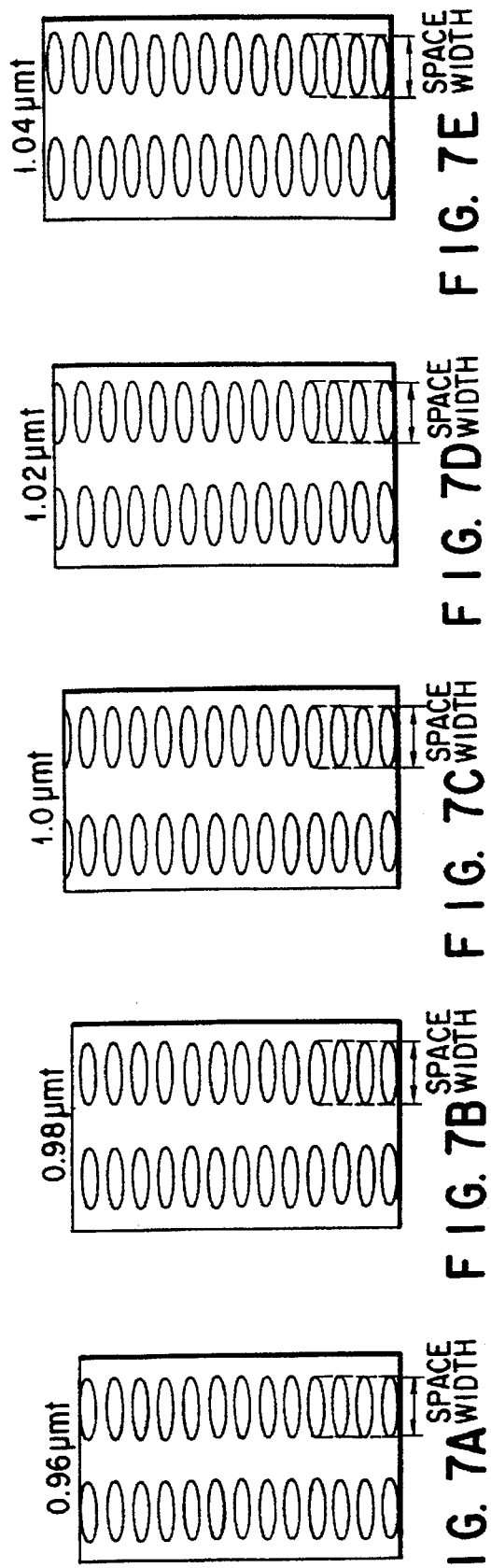

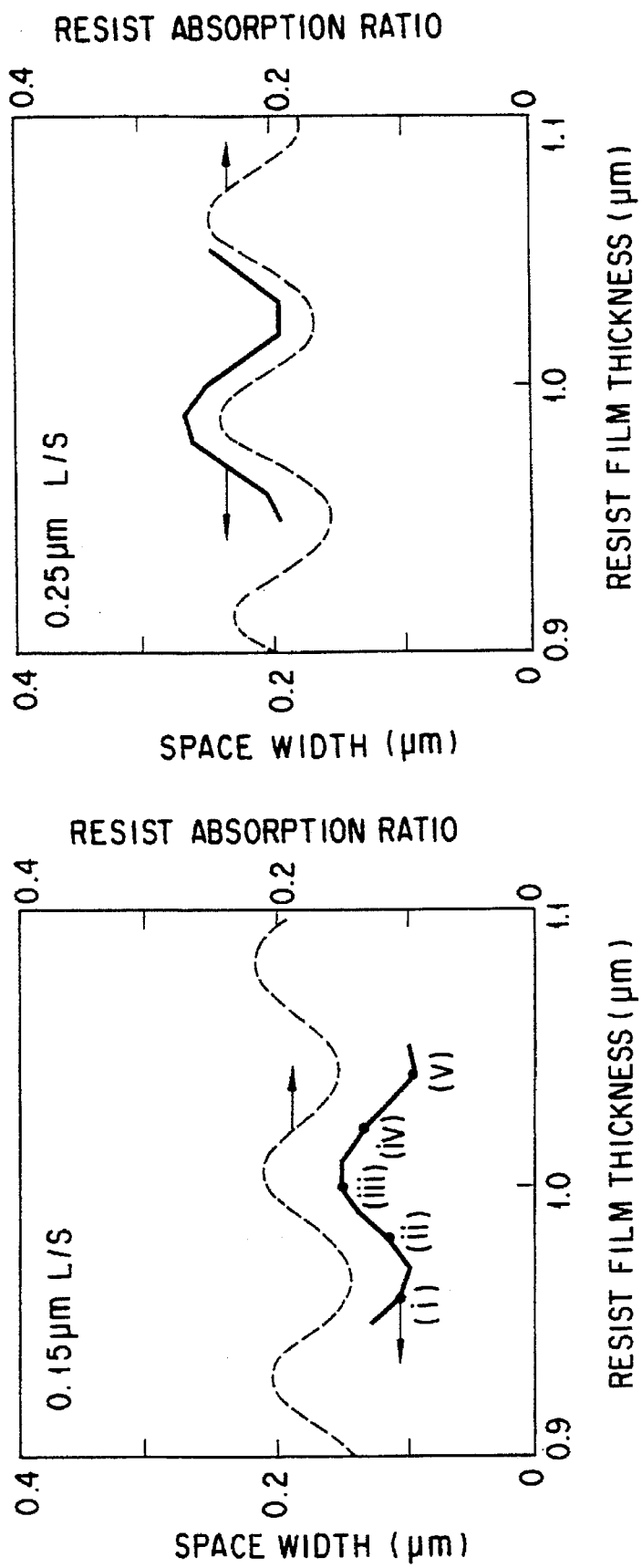

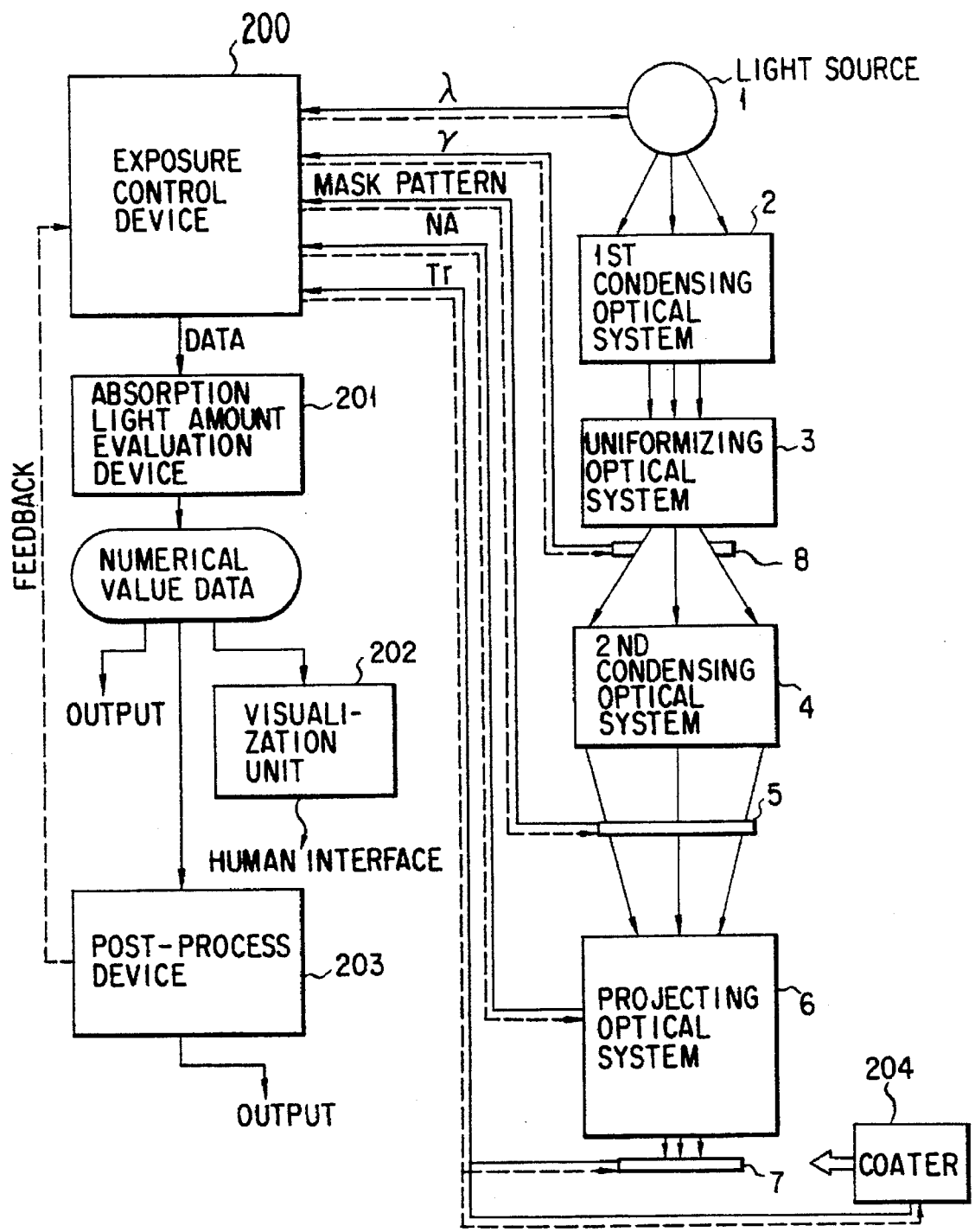
F I G. 8

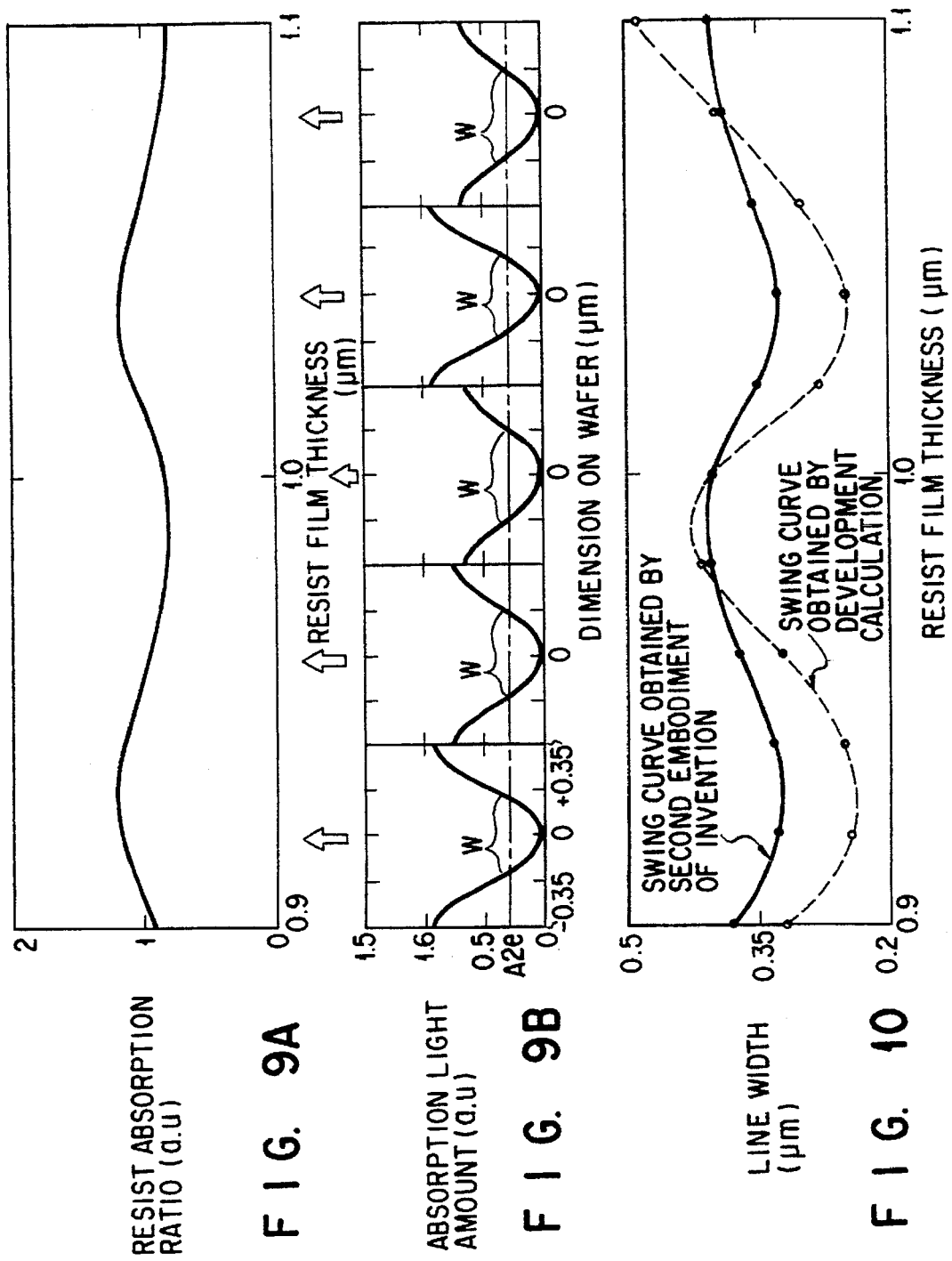

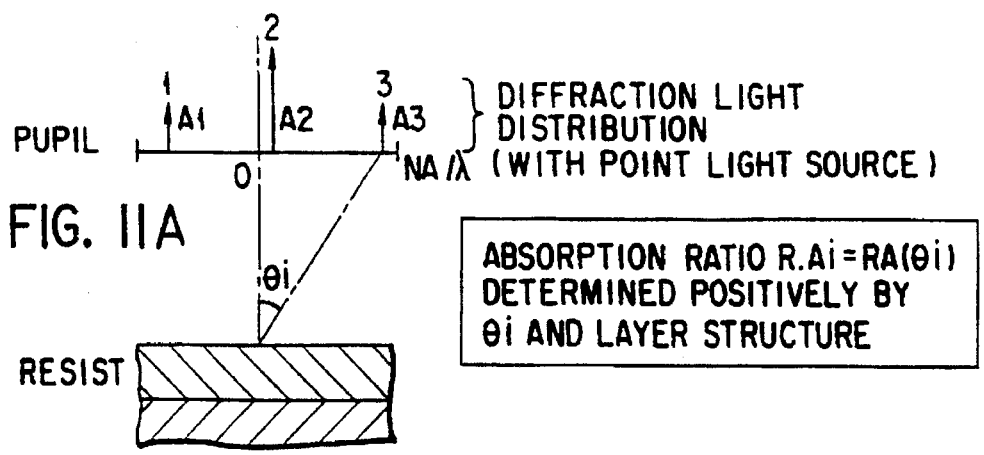
FIG. 11A
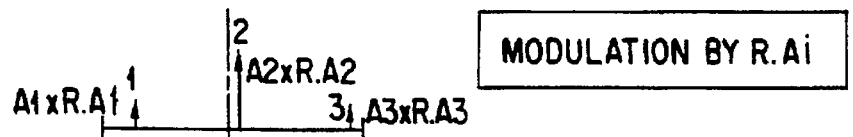
FIG. 11B
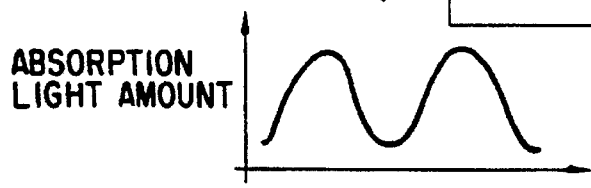
FIG. 11C
FIG. 11D
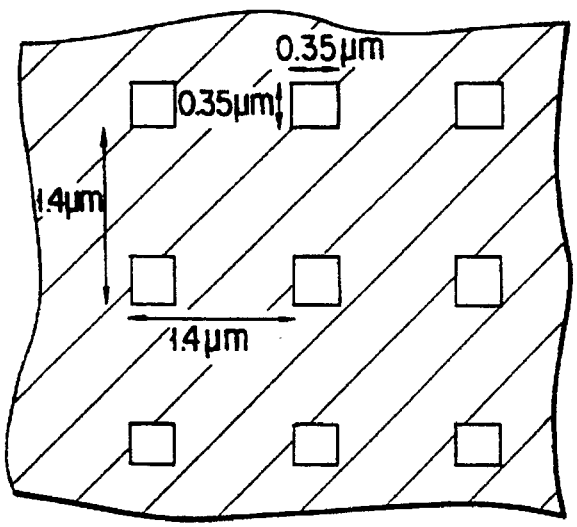
FIG. 12

METHOD AND SYSTEM FOR EVALUATING DISTRIBUTION OF ABSORPTION LIGHT AMOUNT IN OPTICAL LITHOGRAPHY

BACKGROUND OF THE INVENTION

1. Field of the Invention

The present invention relates to a method and a system for evaluating an absorption light amount distribution in a resist in photolithography, and evaluating a bottom shape of a resist pattern on a wafer surface.

2. Description of the Related Art

In the technical field of photolithography, there is a demand for a pattern with fineness close to a maximum limit resolution of a reduction-projection type exposing apparatus, with a development in integration density of an LSI. Accordingly, there is a problem of critical dimension control of a resist pattern formed on a wafer. A variation in thickness of a resist film is known as a factor of a variation in dimensions of the resist pattern. The variation in resist film thickness is mainly due to a variation in amount of light absorbed in a resist (hereinafter referred to as "variation in absorption light amount") which is caused by an optical interference effect within a multi-layer structure on a semiconductor substrate including the resist. The dependency of the resist pattern upon the resist film thickness is generally called "swing curve". The dependency of the absorption light amount upon the resist film thickness is also called "swing curve" in general. By contrast, in the prior art, the amount of light absorbed in the resist is calculated, assuming that the light to be absorbed is made incident normal to a multi-layer film including a resist.

However, since the use of an exposing apparatus with a high NA (numerical aperture), a modified illumination and a phase-shifting mask has recently been considered, a possible result based on the aforementioned assumption may differ from an actual result. For example, the papers titled, "Thin-film interference effects in photolithography for finite numerical aperture" in *Journal of Optical Society America A*, Vol. 8, No. 1, pp. 123, Douglas A. Bernard, et al., and "Optimization of optical properties of resist processes" in *SPIE Advances in Resist Technology and Processing*, VIII Vol. 1466, p. 297, T. A. Brunner, show, based on calculations, that in accordance with the angle of incidence of light on the resist, the absorption light amount in a resist varies, or the reflectance on the surface of the resist varies.

In addition, the paper titled "Characteristics of Standing Wave Effect of Off-axis Illumination Depending on Two Different Resist Systems and the Polarization Effect of Stepper" in *SPIE Optical/Laser Microlithography*, VII, Vol. 2197, p 42, K. H. Kim, et al., demonstrates, based on experiments, that the swing curve obtained under oblique illumination differs from that obtained under normal illumination.

Thus, there has been a need for a calculation model of absorption light amount in a resist in consideration of an NA, a light source shape (coherence factor σ), and diagonal incidence light on a wafer surface due to diffraction by a mask pattern.

On the other hand, the paper, titled "A general simulator for VLSI lithography and etching processes: Part 1—Application to projection lithography" in *IEEE Trans. Electron Devices*, Vol. ED-26, No. 12, p. 717, W. G. Oldham, et al., shows an example of a simulator for performing development calculations by conversion to a dis-solving rate in a resist on the basis of a latent image distribution formed in the resist. A resist profile simulator such as a SAMPLE (Simulation and Modeling of Profiles for Lithography and Etching), described in this paper, is well known.

It is possible to find the swing curve by calculating a desired exposure condition and a resist line width obtained from a mask pattern, with use of the above resist profile simulator. However, in the above calculation, it is necessary to find the shape of the resist. Consequently, the calculation time is longer than in the conventional method. It is difficult to use this method, for example, in determining an optimal design of an anti-reflective layer to be formed on a semiconductor substrate.

When a resist pattern shape evaluation is performed with the aim of optical proximity correction (OPC) in consideration of even a multi-layer structure on a wafer, it is necessary to perform a shape evaluation calculation in a region of a certain width. Thus, when the shape evaluation calculation is performed after a latent image distribution in the resist is strictly found, the calculation time is too long.

On the other hand, in the case where a resist pattern shape evaluation calculation is performed on the basis of the amount of exposure light applied into the resist in proportion to a swing curve value by making use of a result obtained by a conventional swing curve calculation, an effective amount of exposure light applied to a pattern also varies due to each the patterns. As a result, it is not possible to exactly evaluate the resist pattern shape.

As has been described above, in the conventional swing curve calculation method in which only vertical incident light is considered, the influence of the use of an exposing apparatus with a high NA (numerical aperture), a modified illumination and a phase-shifting mask cannot be considered. On the other hand, in the method of calculating the resist pattern and finding the pattern dimensions from the resist pattern, the calculation time increases considerably.

SUMMARY OF THE INVENTION

The object of the present invention is to provide a method and a system capable of quickly evaluating an absorption light amount distribution in a resist in accordance with an NA and value σ of a projection exposure apparatus, a mask pattern for use and a multi-layer film structure on a wafer, and a method and a system capable of exactly and quickly performing a resist pattern shape evaluation by using the these method and system.

The above object can be achieved by a system for evaluating a distribution of an absorption light amount in a resist, the system comprising:

diffractive light intensity distribution calculating means for calculating a diffractive light intensity distribution on a plane of a pupil of a projection exposing apparatus;

light absorption rate calculating means for calculating, on the basis of an incidence angle and a thin-film interference effect of each of diffractive light intensity components of the diffractive light intensity distribution passing through the pupil and being incident on a wafer surface of the projection exposing apparatus, a light absorption rate of each of the diffractive light intensity components in a resist of the projection exposing apparatus;

weight calculating means for calculating a weight of each diffractive light intensity component, on the basis of the light absorption rate of each diffractive light intensity component calculated by the light absorption rate calculating means;

multiplying means for multiplying each diffractive light intensity component of the diffractive light intensity distribution by the weight of each diffractive light intensity component calculated by the weight calculating means; and integrating means for integrating, in the plane of the pupil, each diffractive light intensity component multiplied with the weight obtained by the multiplying means, thereby obtaining an absorption light amount distribution in the resist.

The above object can also be achieved by a system for evaluating a distribution of an absorption light amount in a resist, the system comprising:

diffractive light intensity distribution calculating means for calculating a diffractive light intensity distribution on a plane of a pupil of a projection exposure apparatus on the basis of a numerical aperture, an exposure wavelength, a secondary light source shape and a mask pattern of the projection exposing apparatus;

light amount ratio calculating means for calculating a ratio of a light amount absorbed in a resist of each of diffractive light intensity components of the diffractive light intensity distribution calculated by the diffractive light intensity distribution calculating means;

modulating means for modulating a complex amplitude distribution of the diffractive light intensity in the plane of the pupil in accordance with the light amount ratio calculated by the light amount ratio calculating means; and execution means for executing a partial coherent image focus calculation on the basis of the complex amplitude distribution of the diffractive light intensity modulated by the modulating means, thereby obtaining an absorption light amount distribution in the resist.

The above object can also be achieved by a method of evaluating a distribution of an absorption light amount in a resist, the method comprising:

a diffractive light intensity distribution calculating step of calculating a diffractive light intensity distribution on a plane of a pupil of a projection exposing apparatus;

a light absorption rate calculating step of calculating, on the basis of an incidence angle and a thin-film interference effect of each of diffractive light intensity components of the diffractive light intensity distribution passing through the pupil and being incident on a wafer surface of the projection exposing apparatus, a light absorption rate of each of the diffractive light intensity components in a resist of the projection exposing apparatus;

a weight calculating step of calculating a weight of each diffractive light intensity component, on the basis of the light absorption rate of each diffractive light intensity component calculated in the light absorption rate calculating step;

a multiplying step of multiplying each diffractive light intensity component of the diffractive light intensity distribution by the weight of each diffractive light intensity component calculated in the weight calculating step; and an integrating step of integrating, in the plane of the pupil, each diffractive light intensity component multiplied with the weight obtained in the multiplying step, thereby obtaining an absorption light amount distribution in the resist.

The above object can also be achieved by a method of evaluating a distribution of an absorption light amount in a resist, the method comprising:

a diffractive light intensity distribution calculating step of calculating a diffractive light intensity distribution on a plane of a pupil of a projection exposure apparatus on the basis of a numerical aperture, an exposure wavelength, a secondary light source shape and a mask pattern of the projection exposing apparatus;

a light amount ratio calculating step of calculating a ratio of a light amount absorbed in a resist of each of diffractive light intensity components of the diffractive light intensity distribution calculated in the diffractive light intensity distribution calculating step;

a modulating step of modulating a complex amplitude distribution of the diffractive light intensity in the plane of the pupil in accordance with the light amount ratio calculated in the light amount ratio calculating step; and an execution step of executing a partial coherent image focus calculation on the basis of the complex amplitude distribution of the diffractive light intensity modulated in the modulating step, thereby obtaining an absorption light amount distribution in the resist.

According to the present invention, multi-layer film calculations can be performed with respect to a given incidence angle. Thereby, the absorption light amount distribution can be measured in consideration of NA and $\sigma$ of the optical system. In addition, on the basis of the Parseval's theorem that the total amounts of power spectra of two functions associated by Fourier transform are equal to each other, the resist absorption light amount averaged in the pattern cycle direction can be calculated from the diffractive light intensity distribution by the mask pattern at the pupil position of the projection optical system of the exposure apparatus. Accordingly, swing curves corresponding to the optical system and mask pattern can be quickly measured.

Furthermore, the resist pattern shape can be estimated on the basis of the absorption light amount distribution measured by the present invention and the dissolution rate of the resist associated with the absorption light amount distribution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 4A to 4D show the mask pattern dependency (normalized on the basis of the value, 1 µm, of resist film thickness) of an average absorption light amount;

FIGS. 5A and 5B show diffractive light intensity distributions on pupil planes;

FIGS. 6A and 6B show comparison results between results of the present invention and variations in line width obtained from latent image simulation;

FIGS. 7A to 7E show latent image distributions (equi-photo-intensity lines at the same normalized light intensity);

FIG. 8 shows the relationship between the system of the present invention and the reduction-projection type exposure apparatus shown in FIG. 1;

FIGS. 9A and 9B show a second embodiment of the invention wherein aerial image intensity distribution is converted to an absorption light amount distribution;

FIG. 10 shows a comparison result between a swing curve obtained in the second embodiment of the invention and a swing curve obtained by development simulation;

FIG. 11 shows a simulation method based on a third embodiment of the invention;

FIG. 12 is a view for describing the third embodiment of the invention; and

DETAILED DESCRIPTION OF THE PREFERRED EMBODIMENTS

Figure 1:
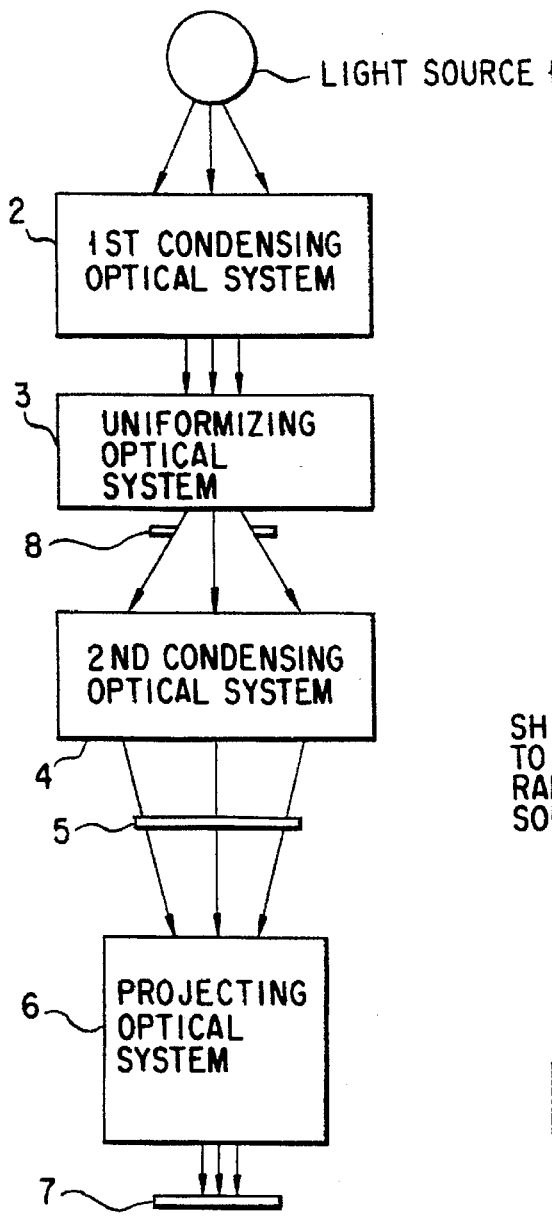
FIG. 1 schematically shows the structure of a reduction-projection type exposure apparatus to which the present invention is applied.
Figure 2:
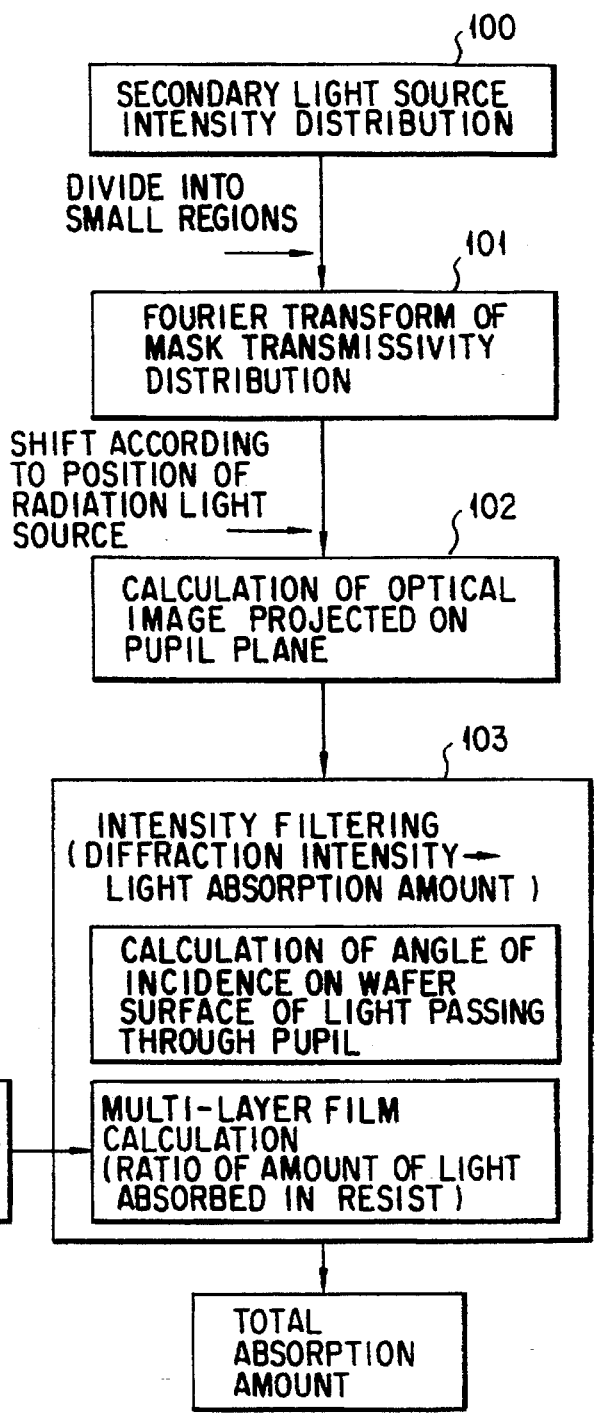
FIG. 2 is a flow chart of a method according to a first embodiment of the invention.
Figure 3A:
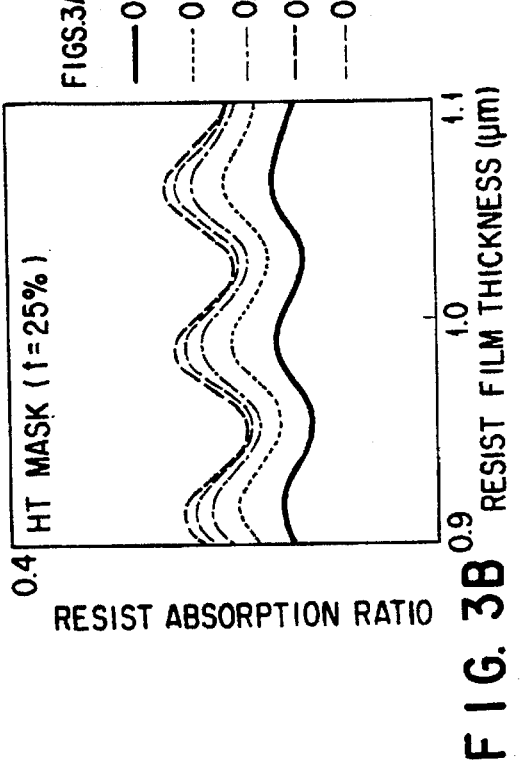
FIGS. 3A to 3D show the mask pattern dependency of an average absorption light amount.
Figure 3B:
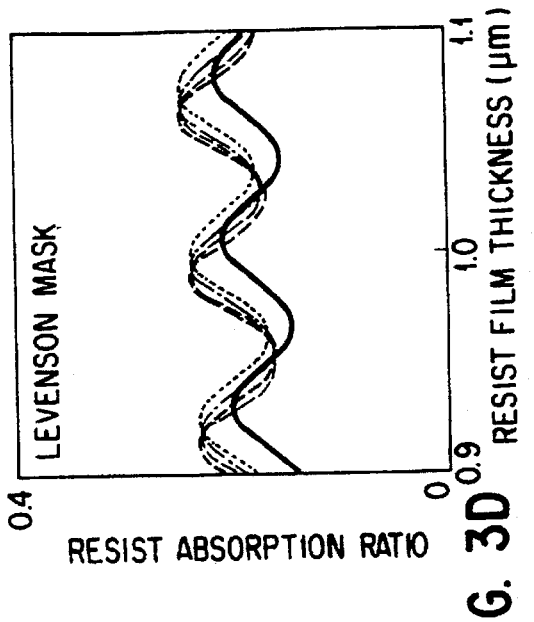
Figure 3C:
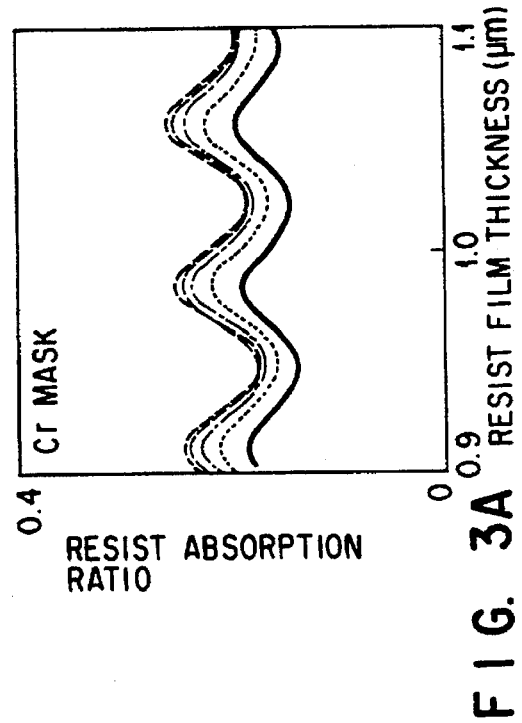
Figure 3D:
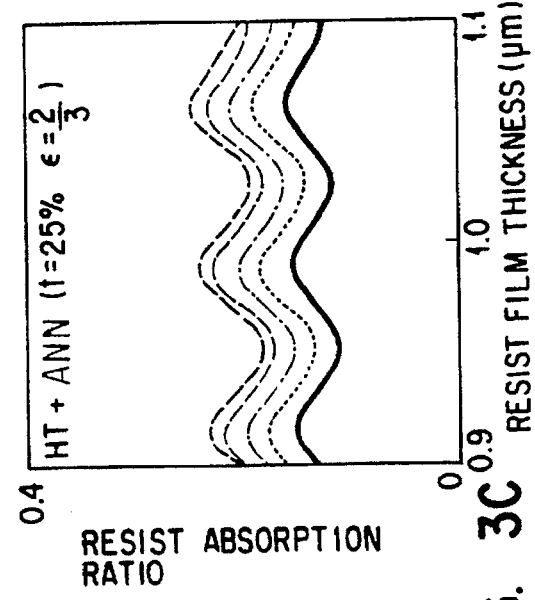

A first embodiment of the present invention will now be described with reference to FIG. 1 showing a reduction-projection type exposure apparatus to which the present invention is applied and FIG. 2 showing a flow chart of the present embodiment.

As is shown in FIG. 1, the reduction-projection type exposure apparatus to which the present invention is applied comprises a light source 1, a first condensing optical system 2, a uniformizing optical system 3, a light source filter 8, a second condensing optical system 4, a mask 5, a projecting optical system 6 and a wafer 7. These structural elements are arranged in this order. The first condensing optical system 2 corresponds to an elliptic reflection mirror and an input lens. In the first condensing optical system 2, a spherical mirror, a flat mirror, a lens, etc. are suitably arranged in addition to the elliptical reflection mirror. The first condensing optical system 2 functions to guide a light beam from the light source 1 to the uniformizing optical system 3 with highest efficiency. The uniformizing optical system 3 corresponds to an optical integrator fly-eye lens). In the uniformizing optical system 3, the fly-eye lens may be replaced with an optical fiber or a polyhedral prism.

The second condensing optical system 4 corresponds to an output lens and a collimation lens. The second condensing optical system 4 superimposes a plurality of emission light beams from the uniformizing optical system 3 and maintains image-surface telecentric properties of the superimposed emission beam. The second condensing optical system 4 may include a filter for passing only a wave-length component subjected to aberration correction and a cold mirror. This filter is inserted in a predetermined position in the second condensing optical system, where the light beam is substantially parallel to the optical axis. The cold mirror is inserted in a specific, but not positively determined position within the second condensing optical system 4.

In the reduction-projection type exposure apparatus having the above structure, the light, as viewed from the position of the mask 5 towards the light source 1, has the characteristics of the light emitted from the uniformizing optical system via the second condensing optical system 4. When the light source side is viewed from the position of the mask 5, the light emission side of the uniformizing optical system 3 can be viewed as an apparent light source. Thus, in the case of the reduction-projection type exposure apparatus having the above structure, the light source filter 8 on the emission side of the uniformizing optical system 3 is generally called "secondary light source" or "effective light source".

When the mask 5 is projected onto the wafer 7, the formation characteristics of the projected exposure pattern, i.e. the resolution, depth of focus (DOF), resist shape, etc., are determined by the numerical aperture NA of the projecting optical system 6, the secondary light source 8 for irradiating the mask 5, the refractive index and thickness of a multi-layer film including a resist on the wafer, etc.

The light intensity distribution of the secondary light source 8 shown in FIG. 1 is used as the light intensity distribution for the method of the present embodiment as shown in FIG. 2 (step 100). In the simulation method according to the first embodiment of the invention, the secondary light source is divided into small regions. The divided regions are expressed by representative points. It is considered that light beam components emitted from the different regions are incoherent each other. The sum of the beam components as the absorption light amount emitted from the respective representative points is calculated on the basis of the fact that the sum of the beam components is the sum of the beam components from the respective point light sources.

The beam components emanating from the respective small regions are diffracted by a mask pattern. The diffracted beam components enter the projecting optical system. Higher-order components are eliminated from the diffracted components by means of the pupil of the projecting optical system. The resultant beam components are focused on the wafer surface. As is shown in FIG. 2, the diffracted light (diffractive light intensity) distribution on the pupil is obtained by shifting, by a degree corresponding to a predetermined eccentric position from the optical axis of the small light sources, the distribution of a Fourier-transformed mask pattern (steps 101 and 102). The diffracted light with this distribution forms a latent image on the wafer surface. The reason for this is that the diffracted light within the resist is multiple-reflected by the presence of the resist and substrate. In the calculation of the swing curve, it is necessary to find the absorption light amount in the case where mutually coherent plane waves are incident on the resist at different incidence angles. In this case, the absorption light amount has distributions both in the film thickness direction and the wafer surface direction at the same time. These distributions depend on the defocus position and the pupil function. Thus, it is difficult to find the absorption light amount by a conventional method. A latent image simulator is necessary for strict calculation of the absorption light amount. However, a great deal of calculation time would needed if calculations are performed on various film structures.

In the conventional swing curve calculation, the resist absorption light amount obtained when a mask pattern is not provided is used on the assumption that the thickness-directional profile of the latent image distribution in the resist does not greatly vary due to the variation in film thickness. The idea that the main cause of the line width variation is the variation in average amount of light absorbed in the resist is adopted.

In the simulation method according to the first embodiment of the invention, the above assumption and method are used as they are. Specifically, although the obliquely incidence effect resulting from diffraction due to the light source or mask is considered, an average value of absorption light at a pattern cycle is calculated. Since the above assumption is used, the influence upon the present embodiment by the absorption light amount distribution in the resist, e.g. anisotropy of light width variation according to the defocusing direction, cannot be considered. It is considered, however, that the phase error of the swing curve, etc. between different film structures or mask patterns due to the diagonal incidence error can be calculated more precisely than in the prior art.

Under the above assumption, there is no substantial difference between the calculation method for finding an average value of absorption rate at a pattern cycle and the calculation method for individually calculating the absorption light amount for each component of each incidence plane wave and finding an average value of added absorption light amounts.

Consideration will now be given of the case where a photoelectric field distribution E (x, z=d) at a certain depth d in the resist is Fourier-transformed.

$$E(x, z=d)=\int \hat{E}(v, z=d)\exp(2\pi i v x)dv$$

A transform coefficient (Fourier coefficient) of Fourier transfer is equal to an amplitude intensity of plane waves constituting the photoelectric field distribution. The Fourier coefficient can be derived by a multi-layer film theory on the basis of a diffractive light intensity distribution formed on the pupil plane by the mask pattern and the multi-layer film structure on the substrate including the resist. On the other hand, according to the Parseval's theorem, the total amount of power spectra of each of the functions having the Fourier transform relationship is equal.

$$\int |E(x)|^2 dx = \int |\hat{E}(v)|^2 dv$$

Accordingly, the light intensity distribution at the depth d in the resist is equal to the total intensity of plane waves constituting the photoelectric distribution at the depth d in the resist, i.e. the total intensity of diffracted beam components obtained when the diffracted light components passing through the pupil plane are subjected to filtering defined by the multi-layer film structure on the wafer surface. A calculation method of an electric field in a multi-layer film is disclosed, for example, in "Computations in Thin Film Optics" in Vacuum, Vol. IV No. 1, p. 3, W. Weinstein. In this method, if an electric field is divided into a component $E^+$ traveling in the same direction as incident light and a component $E^-$ traveling in the reverse direction due to reflection, an average absorption light amount A(d) is given by $$A(d)=I^+(d)-I^+(0)+I^-(0)-I^-(d), \quad I^\pm = \int |E^\pm(x)|^2 dx$$

FIGS. 3A to 3D show examples of absorption light amount calculations according to the first embodiment of the invention. The exposure parameters for the calculations were set, as stated below. In the absorption light amount calculations, the absorption light components are normalized such that the intensity of each light component reaching the resist surface is equalized when no pattern is formed on the substrate. The conditions for exposure are as follows:

NA=0.5, λ=248 nm.
resist (n=1.70-0.01i), on Si (n=1.5-3.42i)

A mask pattern used for the calculations is as follows. The coherence factor σ indicating the magnitude of the secondary light source is set at σ=0.3 for a Levenson mask and at σ=0.5 for other mask patterns. As regards a half-tone type mask, calculations were performed under annular illumination (ANN).

The masks were a Cr mask (Cr), a half-tone mask (HT) and a Levenson mask (Lev).

HT complex amplitude transmissivity t=25%,
Central obscuration ratio ε=⅔
The pattern size is 0.25 to 0.45 µmL/S for the Cr mask and HT mask, and 0.15 to 0.25 µmL/S for the Lev mask.

FIGS. 3A to 3D show variations in absorption light amount when the L/S pattern size was applied to each mask, and FIGS. 4A to 4D show variations when the absorption light amount at the time when the film thickness is 1 µm is normalized at 1. It is understood that in particular, when the Levenson type phase-shifting mask, as compared to the other masks, is used, the phase of absorption light in relation to the film thickness variation is displaced according to the line width. As it is understood by comparison between FIGS. 5A and 5B, it appears that the obliquely incidence effect becomes visible in the case where diffracted beam components are distributed relatively in the peripheral portions of the pupil. The reason why there is no substantial difference between the HT+zone mask and the regular mask appears to be that the obliquely incidence effect is not easily exhibited since 0-th order light is distributed near the central part of the pupil. In the HT mask, as compared to the regular mask, the variation in absorption light amount is generally greater than the variation in line width. The reason for this appears to be that the ratio of the 1st-order diffracted light component relatively increases when the HT mask is used and the influence of diffracted light cut off by the pupil becomes clearer.

As regards the Levenson mask the swing curve calculation result of which differs particularly from the prior-art result, comparison was performed with the result of latent image calculation carried out with the resist film thickness varied. In the comparison method, the resist shape calculation was not conducted. An average image intensity distribution obtained by averaging the latent image distribution in the film thickness direction was used. The reason for this is that there is an uncertain element in the process, such as a resist development parameter, in the case of using a development simulator, and the degree of influence cannot sufficiently estimated.

In FIGS. 6A and 6B, line width variations due to film thickness variation are plotted with respect to the average image intensity distributions obtained by the latent image simulation, by using the light intensity (edge light intensity) with which desired dimensions are obtained when the resist film thickness is 1 µm. It is understood that a good relationship is obtained between the absorption light amount variation obtained from the calculation using the simulation method of the present invention and the swing curve of the line width obtained from the latent image distribution. FIGS. 7A to 7E show calculation results of latent image distributions of the Levenson mask in the just in-focus state. The latent image distributions represent locations in the resist film with a light intensity equal to an edge light intensity obtained from the above average light intensity distribution. It is understood that the spatial shape of the latent image does not vary greatly in relation to the film thickness variation but varies in a biased manner in accordance with the average variation in absorption light amount. It is considered that when the above latent image distribution is obtained, there is a good relationship between the swing curve obtained by the simulation method of the present invention and the line width variation.

The calculation time needed in the simulation for finding the swing curve according to the first embodiment of the invention will now be described. In the calculation, a Levenson mask with a size of 0.15 µm was used under the above conditions. In addition, the calculation was conducted on the same work station under the conditions: spatial division number per cycle=128 and light source division number=100.

The calculation time for a certain film thickness was 0.5 second in the simulation according to the present invention, and 240 seconds in the latent image simulation. The calculation time for obtaining the results shown in FIGS. 7A to 7E was 6 seconds in the simulation according to the present invention and 44 minutes in the latent image simulation.

By using the simulation method of the present invention, it is possible to perform calculation for a multi-layer film structure within about one minute, even if the division number or range of film thickness is increased. This calculation speed is considered to be sufficient in examining, e.g. characteristics of a reflection preventing film with respect to various multi-layer film structures.

The evaluation amount or the absorption light amount obtained by the above method can be effective used in fabricating a semiconductor device by means of photolithography, if the evaluation amount is measured and utilized in the following manner. FIG. 8 shows a system, according to the present invention, for evaluating an absorption light amount in a resist. This system is applied to the reduction-projection type exposure apparatus shown in FIG. 1. This system can measure absorption light amount data and make use of the measured absorption light amount data in fabricating a semiconductor device. Specifically, the system of this invention comprises some or all of the structural elements of the reduction-projection type exposure apparatus shown in FIG. 1, as well as an exposure control device 200 or a system controller, an absorption light amount evaluation device 201, a visualizing unit 202, a post-process device 203 and a coater 204 or a resist coating device. The exposure control device 200 extracts various parameters (wavelength $\lambda$, effective light source $\sigma$, mask pattern, numerical aperture NA, resist film thickness Tr, etc.) from the light source 1, first condensing optical system 2, uniformizing optical system 3, light source filter 8, second condensing optical system 4, mask 5, projecting optical system 6, wafer 7 and coater 204. In addition, the exposure control device 200 delivers varied parameters to the light source 1, first condensing optical system 2, uniformizing optical system 3, light source filter 8, second condensing optical system 4, mask 5, projecting optical system 6, wafer 7 and coater 204.

The various parameters extracted by the exposure control device 200 are supplied to the absorption light amount evaluation device 201. The absorption light amount evaluation device 201 calculates the absorption light amount by the above method and outputs the calculation result as numerical value data. The numerical value data representing the absorption light amount is supplied to the visualization unit 202 and visualized so that the operator can visually evaluate the absorption light amount. In addition, the numerical value data representing the absorption light amount, which has been output from the absorption light amount evaluation device 201, is delivered to the post-process device 203. The post-process device 203 generates a feedback signal on the basis of the numerical value data and supplies the feedback signal to the exposure control device 200.

In the above system, the resist film thickness dependency of the absorption light amount is found, and the coating film thickness is set at, e.g. a value at which the variation in absorption light amount in relation to the film thickness is minimum. Thereby, the variation in resist pattern dimensions in relation to the variation in film thickness can be reduced in the coating process. Thus, the process margin can be increased.

Furthermore, the shape of the resist pattern is evaluated in consideration of the absorption light amount. Thereby, the precision of estimation in pattern shape is enhanced. If the mask pattern and the exposure conditions (NA, $\sigma$, $\lambda$, etc.) are biased to be closer to a desirable pattern shape are altered, the yield and reliability of semiconductor devices to be fabricated can be enhanced. In this case the bias amount is give by the estimation in the pattern shape.

A second embodiment of the present invention will now be described. FIGS. 9A, 9B and 10 show swing curves calculated with use of spatial image distributions obtained by using the following exposure conditions and mask pattern:

NA=0.63, $\lambda$=365 nm,
resist (n=1.70-0.0026i), on Si (n=6.4838-2.5297i)
0.35 μmL&S pattern (HT mask, t=25%)

The spatial image distribution is converted to an absorption light amount distribution, as shown in FIG. 9B, on the basis of the absorption light amount obtained in the first embodiment, as shown in FIG. 9A. In this embodiment, the method of evaluating the resist pattern shape employs such a model that when the absorption light amount is not greater than a threshold, the corresponding dissolution rate of the resist is zero, and, when it is greater than the threshold, the corresponding dissolution rate is the highest.

In FIG. 10, the line width in a region where the absorption light amount is greater than a predetermined threshold (Ab_e) was plotted with respect to each of the absorption light amount distribution.

FIG. 10 also shows a swing curve obtained by finding a latent image distribution and performing a development calculation. It is understood that the phases of both swing curves coincide in good condition. Thus, the data on the variation in exposure light amount due to a difference of substrates or the variation in exposure light amount due to the influence of diagonal incidence in the optical system can be used for the simulation.

Similarly, it is understood that the same results can be obtained if the variation in dimension is obtained from the absorption light amount obtained in the first embodiment by varying the predetermined absorption light amount Ab_e. In FIG. 10, it appears that the calculation method in which the variation width is found by considering even the resist shape differs from the method of the present invention. The reason is that in the calculation of this method the dissolution characteristics of the resist are not considered. The variation width can be calculated with higher precision, for example, if the dimension is obtained on the basis of Ab_e with respect to the result of conversion from the absorption light amount distribution to the dissolution rate distribution, according to the exposure light/dissolution rate curve of the resist. The degree of coincidence of not only the phase of the swing curve but also the amplitude of the swing curve is enhanced if a development model, more realistic than a simple one, is used.

A third embodiment of the present invention will now be described. The third embodiment relates to an example of a calculation for evaluating a resist pattern shape on the basis of an absorption light amount distribution. The absorption light amount is obtained with respect to each plane wave incident on the resist.

Figure 13A:
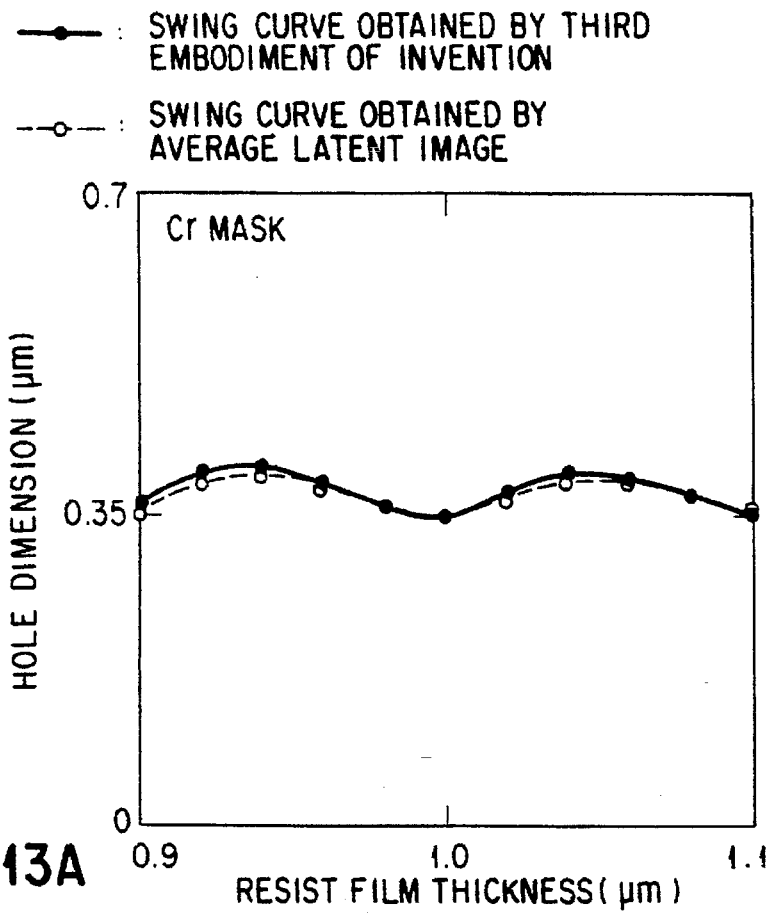
FIGS. 13A and 13B show swing curves of contact holes in the third embodiment of the invention.
Figure 13B:
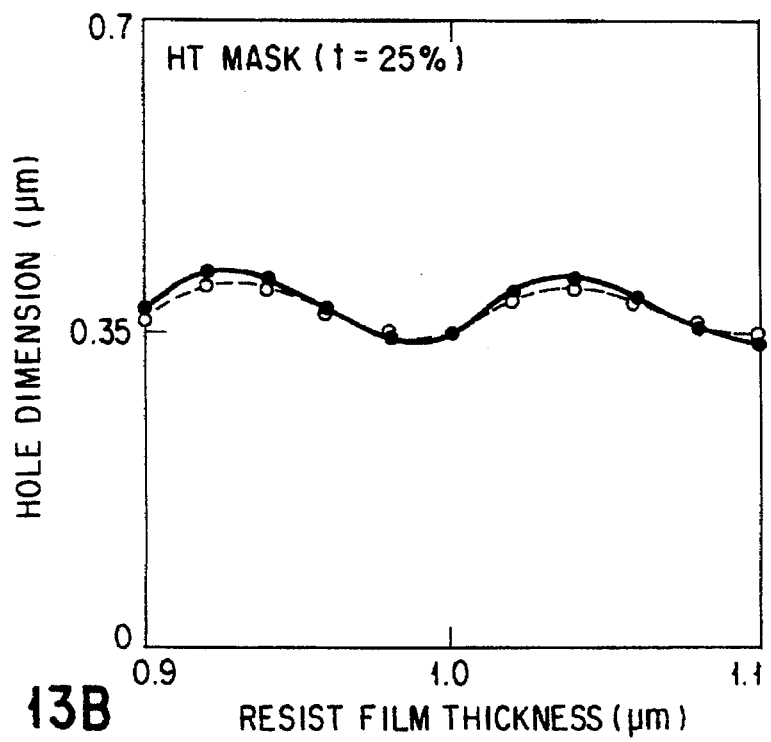

As is shown in FIG. 11, the absorption light amount is displayed in amplitude with respect to each diffracted light component. As regards the phase thereof, the value at a given point in space is used. Thereby, a Fourier-transformed absorption light amount distribution on the pupil plane is obtained. This distribution is inversely Fourier-transformed. Thus, the absorption light amount distribution is calculated. FIGS. 12, 13A and 13B show calculation results of the present invention. The conditions for exposure are as follows:

NA=0.63, λ=365 nm, σ=0.6,
resist (n=1.70-0.0026i), on Si(n=6.4838-2.5297i)

As is shown in FIG. 12, the contact hole pattern is a 0.35 µm contact hole pattern (inter-hole pitch=1.4 λm).

FIGS. 13A and 13B show a shape calculation result of a resist pattern on a wafer surface, which is based on the absorption light amount distribution obtained by the present invention, and a calculation result using an average image intensity distribution obtained by integrating a latent image distribution in the film thickness direction. It is understood from FIGS. 13A and 13B that both swing curves coincide in phase in good condition. In the above method, the absorption light amount distribution is calculated on the basis of a partial coherent image focus calculation. Consequently, the calculation time is slightly longer than in the method of the first embodiment of the invention. However, the calculation time can be greatly decreased, compared to the case of strictly calculating the latent image. The reason is that in the latent image calculation, image focus calculations are performed in all planes in the resist in the thickness direction whereas in the present method only one image focus calculation is needed. By using the above method, the phase of the swing curve can be precisely obtained with respect to patterns other than the L/S pattern.

As has been described above, according to the present invention, multi-layer film calculations can be performed with respect to a given incidence angle. Thereby, the absorption light amount distribution can be measured in consideration of NA and σ of the optical system.

The present invention is based on the Parseval's theorem that the total amounts of power spectra of two functions associated by Fourier transform are equal to each other. Therefore, the resist absorption light amount averaged in the pattern cycle direction can be calculated from the diffractive light intensity distribution by the mask pattern at the pupil position of the projection optical system of the exposure apparatus. Accordingly, swing curves corresponding to the optical system and mask pattern can be quickly measured.

Furthermore, the resist pattern shape can be estimated on the basis of the absorption light amount distribution measured by the present invention and the dissolution rate of the resist associated with the absorption light amount distribution.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A system for evaluating a distribution of an absorption light amount in a resist, said system comprising:

diffractive light intensity distribution calculating means for calculating a diffractive light intensity distribution on a plane of a pupil of a projection exposing apparatus;

light absorption rate calculating means for calculating, on the basis of an incidence angle and a thin-film interference effect of each of diffractive light intensity components of said diffractive light intensity distribution passing through said pupil and being incident on a wafer surface of said projection exposing apparatus, a light absorption rate of each of the diffractive light intensity components in a resist of said projection exposing apparatus;

weight calculating means for calculating a weight of each diffractive light intensity component, on the basis of the light absorption rate of each diffractive light intensity component calculated by said light absorption rate calculating means;

multiplying means for multiplying each diffractive light intensity component of the diffractive light intensity distribution by the weight of each diffractive light intensity component calculated by said weight calculating means; and integrating means for integrating, in the plane of the pupil, each diffractive light intensity component multiplied with the weight obtained by said multiplying means, thereby obtaining an absorption light amount distribution in the resist.

2. The system according to claim 1, further comprising multiplying means for multiplying the resist absorption light amount distribution obtained by said integrating means by a light intensity distribution on the wafer obtained on the basis of a numerical aperture, an exposure wavelength, a secondary light source shape and a mask pattern of the projection exposing apparatus.

3. The system according to claim 2, further comprising:

dissolution rate distribution calculating means for calculating a dissolution rate distribution of the resist on the wafer on the basis of the distribution of light absorption on the wafer obtained by said multiplying means and on the basis of the dissolution rate of the resist corresponding to the absorption light amount at each point on the distribution of light absorption; and evaluation means for evaluating a resist pattern shape after development in accordance with a predetermined development time, on the basis of the dissolution rate distribution of the resist on the wafer calculated by said dissolution rate distribution calculating means.

4. The system according to claim 2, further comprising evaluation means for evaluating, as a resist pattern after development, a part of the absorption light amount distribution on the wafer obtained by said multiplying means, wherein said part satisfies the following condition:

B(x, y):R(x, y).T(sec)≦Tr(µm/sec) in which B(x, y)=a region of said part,

T(sec)=time for development,

R(x, y)=(µm/sec) dissolution rate distribution converted from the absorption light amount distribution obtained by said calculation on the basis of resist dissolution data, and Tr (µm)=resist film thickness.

5. A system for evaluating a distribution of an absorption light amount in a resist, said system comprising:

diffractive light intensity distribution calculating means for calculating a diffractive light intensity distribution on a plane of a pupil of a projection exposure apparatus on the basis of a numerical aperture, an exposure wavelength, a secondary light source shape and a mask pattern of the projection exposing apparatus;

light amount ratio calculating means for calculating a ratio of a light amount absorbed in a resist of each of diffractive light intensity components of the diffractive light intensity distribution calculated by said diffractive light intensity distribution calculating means;

modulating means for modulating a complex amplitude distribution of the diffractive light intensity in the plane of the pupil in accordance with the light amount ratio calculated by said light amount ratio calculating means; and execution means for executing a partially coherent imaging calculation on the basis of the complex amplitude distribution of the diffractive light intensity modulated by said modulating means, thereby obtaining an absorption light amount distribution in the resist.

6. The system according to claim 5, further comprising:

dissolution rate distribution calculating means for calculating a dissolution rate distribution of the resist on the wafer on the basis of the distribution of light absorption on the wafer obtained by said execution means and on the basis of the dissolution rate of the resist corresponding to the absorption light amount at each point on the distribution of light absorption; and evaluation means for evaluating a resist pattern shape after development in accordance with a predetermined development time, on the basis of the dissolution rate distribution of the resist on the wafer calculated by said dissolution rate distribution calculating means.

7. The system according to claim 5, further comprising evaluation means for evaluating, as a resist pattern after development, a part of the absorption light amount distribution on the wafer obtained by said execution means, wherein said part satisfies the following condition:

$B(x, y):R(x, y).T(sec) \leq Tr(\mu m/sec)$ in which $B(x, y)=a$ region of said part, $T(sec)$=time for development, $R(x, y)(\mu m/sec)$=dissolution rate distribution converted from the absorption light amount distribution obtained by said calculation on the basis of resist dissolution data, and $Tr (\mu m)$=resist film thickness.

8. A method of evaluating a distribution of an absorption light amount in a resist, said method comprising:

a diffractive light intensity distribution calculating step of calculating a diffractive light intensity distribution on a plane of a pupil of a projection exposing apparatus;

a light absorption rate calculating step of calculating, on the basis of an incidence angle and a thin-film interference effect of each of diffractive light intensity components of said diffractive light intensity distribution passing through said pupil and being incident on a wafer surface of said projection exposing apparatus, a light absorption rate of each of the diffractive light intensity components in a resist of said projection exposing apparatus;

a weight calculating step of calculating a weight of each diffractive light intensity component, on the basis of the light absorption rate of each diffractive light intensity component calculated in said light absorption rate calculating step;

a multiplying step of multiplying each diffractive light intensity component of the diffractive light intensity distribution by the weight of each diffractive light intensity component calculated in said weight calculating step; and an integrating step of integrating, in the plane of the pupil, each diffractive light intensity component multiplied with the weight obtained in said multiplying step, thereby obtaining an absorption light amount distribution in the resist.

9. The method according to claim 8, wherein said diffractive light intensity distribution calculation step includes a step of calculating the diffractive light intensity distribution on the basis of secondary light with a predetermined light distribution, which secondary light is emitted from the secondary light source of the projection exposure apparatus and diffracted by the mask pattern of the projection exposure apparatus.

10. The method according to claim 8, further comprising a multiplying step of multiplying the resist absorption light amount distribution obtained by said integrating step by a light intensity distribution on the wafer obtained by a numerical aperture, an exposure wavelength, a secondary light source shape and a photomask pattern shape of the projection exposure apparatus as well as a layer structure of the projection exposure apparatus including a photoresist on a semiconductor substrate, thereby obtaining an absorption light amount distribution on the wafer.

11. The method according to claim 10, further comprising a dissolution rate distribution calculating step for calculating a dissolution rate distribution of the resist on the wafer on the basis of the absorption light amount distribution on the wafer obtained in said multiplying step and on the basis of the dissolution rate of the resist corresponding to the absorption light amount at each point on the absorption light amount distribution; and an evaluation step for evaluating a resist pattern shape after development in accordance with a predetermined development time, on the basis of the dissolution rate distribution of the resist on the wafer calculated in said dissolution rate distribution calculating step.

12. The method according to claim 10, further comprising an evaluation step for evaluating, as a resist pattern after development, a part of the absorption light amount distribution on the wafer obtained in said multiplying step, wherein said part satisfies the following condition:

$B(x, y):R(x, y).T(sec) \leq Tr(\mu m/sec)$ in which $B(x, y)=a$ region of said part, $T(sec)$=time for development, $R(x, y)(\mu m/sec)$=dissolution rate distribution converted from the absorption light amount distribution obtained by said calculation on the basis of resist dissolution data, and $Tr (\mu m)$=resist film thickness.

13. A method of evaluating a distribution of an absorption light amount in a resist, said method comprising:

a diffractive light intensity distribution calculating step of calculating a diffractive light intensity distribution on a plane of a pupil of a projection exposure apparatus on the basis of a numerical aperture, an exposure wavelength, a secondary light source shape and a mask pattern of the projection exposing apparatus;

a light amount ratio calculating step of calculating a ratio of a light amount absorbed in a resist of each of diffractive light intensity components of the diffractive light intensity distribution calculated in said diffractive light intensity distribution calculating step;

a modulating step of modulating a complex amplitude distribution of the diffractive light intensity in the plane of the pupil in accordance with the light amount ratio calculated in said light amount ratio calculating step; and an execution step of executing a partial coherent image focus calculation on the basis of the complex amplitude distribution of the diffractive light intensity modulated in said modulating step, thereby obtaining an absorption light amount distribution in the resist.

14. The method according to claim 13, further comprising:

a dissolution rate distribution calculating step of calculating a dissolution rate distribution of the resist on the wafer on the basis of the distribution of light absorption on the wafer obtained in said execution step and on the basis of the dissolution rate of the resist corresponding to the absorption light amount at each point on the distribution of light absorption; and an evaluation step of evaluating a resist pattern shape after development in accordance with a predetermined development time, on the basis of the dissolution rate distribution of the resist on the wafer calculated in said dissolution rate distribution calculating step.

15. The method according to claim 13, further comprising an evaluation step of evaluating, as a resist pattern after development, a part of the absorption light amount distribution on the wafer obtained in said execution step, at which part the resist coated on the wafer is completely dissolved within a predetermined time period and at a predetermined dissolution rate or less.

* * * * *